United States Patent [19]

Martinez et al.

[11] Patent Number: 5,029,275
[45] Date of Patent: Jul. 2, 1991

[54] APPARATUS HAVING FLOATING MAGNET UNIT WITH LIGHT REFLECTING MIRROR FOR DETECTING AND INDICATING TO AN OBSERVER THE PRESENCE UPON A PERSON ENTERING A PUBLIC PLACE OF FERROMAGNETIC MATERIAL THAT MAY BE PUT TO HARMFUL USE

[76] Inventors: Gregorio Martinez, 24-47 24th St., Astoria, N.Y. 11002; Angel Garcia, 2971 N. Richey Blvd., Tucson, Ariz. 85716

[21] Appl. No.: 517,756
[22] Filed: May 2, 1990
[51] Int. Cl.$^5$ .................... G01R 33/12; G01R 33/00; G01R 13/38; G08B 13/24
[52] U.S. Cl. ...................... 324/226; 324/97; 324/228; 324/259; 324/262; 340/551
[58] Field of Search .............. 324/200, 226, 228, 259, 324/262, 97, 146, 345, 207.13, 207.26; 33/364, 363 K; 340/551, 568, 572

[56] References Cited

U.S. PATENT DOCUMENTS

| | | | |
|---|---|---|---|
| 2,151,627 | 3/1939 | Vacquier | 324/259 X |
| 2,319,529 | 5/1943 | Britten, Jr. | 33/364 |
| 3,276,030 | 9/1966 | Stauffer | 324/97 X |
| 3,423,672 | 1/1969 | Stockton | 324/259 X |
| 3,508,142 | 4/1970 | Filloux | 324/259 X |
| 4,156,178 | 5/1979 | Stockton | 324/259 X |
| 4,848,002 | 7/1989 | Carmona et al. | 33/364 |

Primary Examiner—Gerard R. Strecker
Attorney, Agent, or Firm—Nicholas J. Garofalo

[57] ABSTRACT

A detector of ferromagnetic materials having a permanent magnet floating in a contaier and restrained under the influence of a soft ferrite mass spaced below it to rotatable movement about a vertical axis centrally of the container. The magnet has a normal at rest position from which it is rotatable when a ferromagnetic material moves through its magnetic field. The magnet carries a curved mirror onto the concaved face of which a light beam is focused, and which beam in an at rest normal position of the magnet is reflected by the mirror onto a zero point of an observer's readout scale. When the magnet is caused to rotate from its at rest position by a ferromagnetic material moving through its magnetic field, the light beam is caused to move away from the zero point; and when the ferromagnetic material has moved out of the magnetic field, the magnet and light beam return to their normal positions but with some oscillation before doing so. Electro-magnets associated with the magnet are subject to energization by an attendant, and when energized they serve to curb such oscillation.

9 Claims, 1 Drawing Sheet

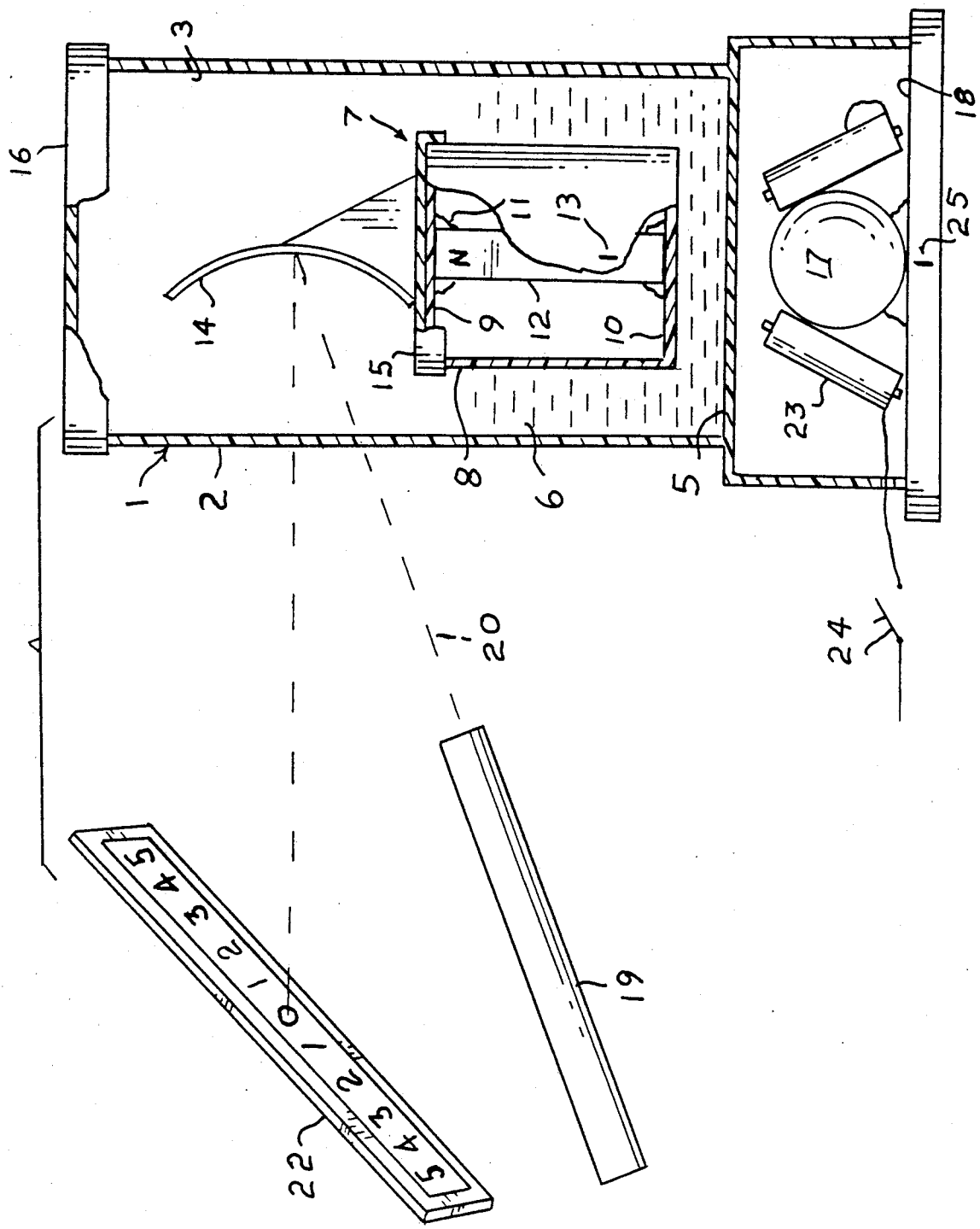

APPARATUS HAVING FLOATING MAGNET UNIT WITH LIGHT REFLECTING MIRROR FOR DETECTING AND INDICATING TO AN OBSERVER THE PRESENCE UPON A PERSON ENTERING A PUBLIC PLACE OF FERROMAGNETIC MATERIAL THAT MAY BE PUT TO HARMFUL USE

BACKGROUND OF THE INVENTION

This invention relates to new and useful improvements in apparatus for detecting metal objects carried on the person, particularly ferromagnetic objects, such as guns, knives and other weapons that could be put to harmful use.

A general object of the present invention is to provide apparatus of a nature which, in comparison with conventional apparatus, is relatively simple in structure, effective for the purposes intended, relatively inexpensive to produce and simple to operate.

A further object is to provide for the foregoing purposes an apparatus which utilizes a rotatable magnet that is actionable by passing ferromagnetic materials and includes informative means that is responsive to actuation of the magnet.

A more particular object of this invention is to provide an apparatus for the foregoing purposes which utilizes a floating magnet for sensing the passing of ferromagnetic material through its magnetic field, and which includes a light beam reflector that is responsive to the sensing action of the magnet to indicate such action on a readout device to an observer.

Conventional apparatus employed to detect the presence of harmful metal objects carried by a person, such as those used at airports, schools, courthouses and other public buildings, are complex in structure and costly. Further, they do not discriminate between ferromagnetic and non-ferromagnetic materials. Accordingly, their response is affected by non-ferromagnetic objects, such as keys and coins. These must be removed from the person prior to his being subjected to the conventional metal detecting apparatus.

BRIEF SUMMARY OF THE INVENTION

The apparatus embodying the present invention, as illustrated in the accompanying drawing, includes a floating magnet unit carrying a permanent magnet upon which magnet unit is mounted a curved mirror. Associated with the mirror is an instrument which focuses a narrow beam of light onto a concave face of the mirror in such manner that in a normal at rest position of the magnet unit the light beam is reflected back to a zero mark on an observer's readout scale. The magnet unit is subject to turning about its axis from its normal position in response to movement of a magnetically attractable object, such as a gun or a knife, passing through its magnetic field. In this action the reflected light beam is caused to move along the readout scale from its zero position. The magnet unit floats within a container; and it is held to turning about its vertical axis due to the influence upon the magnet of a soft ferrite, such as a soft iron mass. The soft ferrite is spaced below the magnet and is aligned with its vertical axis. The greater the permeability of a magnetic mass passing through the magnetic field of the magnet, the greater will be the turning of the magnet and the mirror about its vertical axis with a resultant corresponding movement of the light beam away from the zero position. To avoid any undersirable degree of oscillation of the magnet unit when returning to normal position after a large permeable magnetic mass has passed through its magnetic field, switch operable electro-magnet elements are provided to effect a restraining action on such oscillation. The turning of the magnet unit and the reflected movement of the light beam relative to the readout scale serves to inform an inspector of the presence of a ferromagnetic object on the person of an individual moving through the magnetic field of the magnet.

The particular nature of the invention, its features, objectives and advantages will become increasingly apparent as this specification unfolds in greater detail and as it is read in conjunction with the accompanying drawing. However, it is to be expressly understood that the drawing is for purposes of illustration and to facilitate description; it is not to be construed as limiting the scope of the invention.

BRIEF DESCRIPTION OF THE DRAWING

In the accompanying drawing the FIGURE shown is a composite view of apparatus embodying the invention for detecting ferromagnetic materials.

DETAILED DESCRIPTION OF THE INVENTION

The apparatus disclosed in the drawing includes an assembly 1 for detecting ferromagnetic materials. The assembly has an outer container 2 adapted to be rested upon a table surface. The container is of non-magnetic material; it is preferably cylindrical; and it is preferably of transparent plastic material so as to allow a clear view of its contents. The container has an upper compartment 3 sealed off from a lower compartment by a flat wall 5. The upper compartment is partially filled with a liquid 6, preferably of a kind that is not readily subject to freezing, such as alcohol.

Floating in the liquid is a magnet unit 7. The unit includes a holder or body 8 of non-magnetic material, such as plastic. Here, the holder is cylindrical. It is sealed at its top and bottom respectively by end walls 9, 10. Centered within the holder and fixed at its ends by cement 11 to the top and bottom walls is a permanent magnet 12. A common vertical axis passes through both the holder and the magnet, about which axis the magnet unit is rotatable. The north pole end of the magnet is indicated by the letter N. A guide line 13, marked on the side wall of the holder, is aligned with the north pole of the magnet and points with the magnet in the direction of the earth's north magnetic pole to which the magnet is normally oriented.

A laterally extending concave faced mirror 14 is fixed upon a lid 15 seated over the top wall 9 of the holder. While the lid has a tight fit upon the holder, nevertheless it may be manually adjusted about the holder so as to face the mirror in a proper direction for use of the detector, as will be later described.

An open top end of the upper compartment 3 of the container is closed by a cap 16 which, when needed, may be removed to provide access to the magnet unit within the compartment.

The floating magnet unit 7 is subject to turning in the liquid 6 when the magnet is actuated by a ferromagnetic material moving through the magnetic field of the magnet. To ensure a free turning of the magnet unit at such times so as to avoid its bumping into the surrounding wall of the container, it is of smaller diameter than the compartment in which it floats. However, means is provided for maintaining the turning of the magnet unit about the vertical axis of the container. By such means, as the magnet unit turns, it will be centered within the container and it will be at all times amply clear of the surrounding wall of the container. For this means a non-permanent magnetic mass 17 is provided. Here it is a soft ferrite in the form of a ball, and it is fixed, as by cement, to the center of the floor 18 the lower compartment 4. In this arrangement the magnet unit and the soft ferrite are maintained coaxial to one another, that is, a common vertical imaginary axis is maintained through both. This axially aligned condition is obtained due to the forces of the magnet acting upon the soft ferrite mass. While the pull or strength of the attraction of the magnet for the soft ferrite mass is such as to maintain the magnet unit at all times axially centered relative to the soft ferrite mass, it is not strong enough to draw the magnet unit down through the liquid into abutment with the floor 5 of the compartment 3.

Means is provided to visually indicate to an inspector or an observer located at a distance from the container 1 the extent of any turning of the floating magnet unit about its axis from its at rest normal position. This means includes an instrument 19 arranged to focus a pencil or narrow light beam 20 onto the concave face of the mirror 14. Here, a low power laser serves as the instrument 19. The mirror serves to reflect the light beam back to a zero mark 0 on a laterally extending observer's readout scale 22. The lid 15 upon which the mirror is mounted is manually rotatively adjustable to facilitate during assembly of the apparatus positioning of the reflected light beam onto the zero mark of the readout scale.

It is apparent that, upon turning of the floating magnet unit about its axis, the light beam will move angularly with the mirror as the mirror turns as a unit with the magnet unit. The reflected light beam will accordingly move along the readout scale away from the zero position. The extent of movement of the light beam from the zero mark will be proportional to the degree of turning of the magnet unit, as determined by the nature of the magnetic material passing through the magnetic field of the magnet. The stronger the moving mass is attracted by the magnetic field of the magnet, the greater will be the corresponding angular movement of the reflected light beam along the readout scale.

In assembling the apparatus for use, the container member 2 of the assembly 1 is set upon a suitable support. The low power laser or light beam projecting instrument 19 is supported at a distance from the container and in such manner that it will focus a light beam onto the central area of the concave face of the mirror 14. And the informative or observer's readout scale 22 is to be supported in a position so that the reflected light beam appears at the zero mark of the scale. If needed, positioning of the reflected light beam on the zero mark can be facilitated by rotatively adjusting the position of the lid 15 upon which the mirror is mounted.

Now, when an individual carrying a ferromagnetic mass, such as a handgun, a knife or a machine gun, moves through the magnetic field of the magnet, the attraction of the magnet for the ferromagnetic mass will cause the magnet unit to turn about its axis in response to the moving ferromagnetic mass. As the magnet unit turns, a corresponding movement of the mirror will carry the light beam with it so as to cause the reflected beam to move along the readout scale away from its zero position. The extent of this movement will be in direct proportion to the size, proximity and permeability of the ferromagnetic mass moving through the magnetic field of the magnet.

As an individual carrying a ferromagnetic mass moves out of the magnetic field of the magnet, the magnet unit will return to its normal at rest position, and the reflected light beam will be returned to its zero position. At times, as when a large ferromagnetic mass is moving through the magnetic field, there may be some oscillation of the returning magnet unit about its axis and an accompanying back and forth movement of the light beam before the magnet unit comes to rest. At courthouses, schools and airports where there is a steady stream of people being subjected to the detection apparatus, it is desired that some means be provided to abruptly curb this oscillating action. Such is desired to enable without undesirable delay a fast and steady flow of people through the magnetic field of the apparatus.

To the end of curbing this oscillation, electro-magnetic means is provided. Here, electro-magnetic devices 23 are provided to add to the earth's magnetic field and thereby effect a force restraining the magnet unit against undersirable oscillation. The electro-magnetic devices are positioned in the lower compartment 4 of the container 2 at opposite sides of the soft ferrite mass 17, preferably with their north poles uppermost and inclined at a slight angle of about 30 degrees to the vertical axis of the permanent magnet 12. The electro-magnets are fixed in this position against movement relative to the container.

When the electro-magnets are energized, the resulting increase in the earth's magnetic field serves to curb the extent of any oscillation of the magnet unit, and brings it abruptly to a stop. In making use of the apparatus with the electro-magnets, as an individual carrying a ferromagnetic object moves out of the magnetic field of the magnet with a consequent returning action of the magnet unit and the light beam, the inspector controlling the apparatus will close a switch 24 to energize the electromagnets. The magnet unit will then accordingly be restrained against oscillating as it returns to its normal at rest position. The inspector will then open the switch and allow the next person subject to inspection to pass through the magnetic field of the magnet. Operation of the switch is normally unnecessary where a small ferromagnetic object is detected and a small degree of movement of the magnet unit and the light beam occur.

It is to be noted that a guide line 25 is marked upon the side of the container 2. This line is registered with the north poles of the electro-magnets. To ensure that the north poles of the electro-magnets will be aligned with the north pole of the magnet 12 when the apparatus is being set up for operation, the container 2 is to be adjustably rotated until the guide line 25 registers, if it is not already registered, with the guide line 13 indicating the direction of the north pole of the magnet.

While an embodiment of the invention has been illustrated and described in detail, it is to be expressly understood that the invention is not limited thereto. Various changes of form, design or modification may be made for its components without departing from the spirit and scope of the invention as the same will now be understood by those skilled in the art; and it is out intent, therefore, to claim the invention not only as shown and described, but also in all such forms and modifications thereof as may be reasonably construed to fall within the spirit of the invention and the scope of the appended claims.

What is claimed is:

1. Apparatus for detecting and indicating to an observer the presence of ferromagnetic material upon a person carrying such material through the magnetic field of a permanent magnet element of the apparatus, the apparatus comprising in combination: a transparent container partially filled with liquid; a magnet unit floating in the liquid; the unit including a holder, a permanent magnet centered within and fixed in a vertical position to the holder, and a concave faced mirror mounted upon the top the holder; a non-permanent magnetic mass fixed centrally of the container in spaced relation to and below the floating unit, the unit exerting a magnetic force upon the mass whereby it is maintained coaxial with the mass and rotatable about its axis relative to the mass; the unit being adapted to rotate in the liquid from a normal at rest northerly oriented position upon the magnet becoming attracted by a ferromagnetic material caused to be carried by a person through the magnetic field of the magnet; a light beam projecting instrument arranged to cast a beam of light onto the concave face of the mirror; an observer's readout scale positioned at a distance from the unit and having a zero point thereon; the mirror having a normal at rest condition with the unit in which condition a beam of light focused onto the concave face of the mirror is reflected onto the zero point of the scale; and the mirror being adapted upon being carried about with a rotation of the unit to carry the beam of light along the scale from the zero point as an indication to an observer of a ferromagnetic material moving through the magnetic field of the magnet.

2. Apparatus as in claim 1, wherein the non-permanent magnetic mass is a ball of soft ferrite material; energizable electro-magnet means is positioned at opposite sides of the ball and is inclined toward the axis of the magnet; the unit is adapted to return to its at rest position following movement of a ferromagnetic material through its magnetic field and is adapted to oscillate until itscomes to a rest; and the electro-magnet means is adapted upon being energized to curb the oscillation of the unit.

3. Apparatus as in claim 2, wherein the container has an upper compartment in which the magnet unit floats and has a lower compartment walled off from the upper compartment in which lower compartment the ball and electro-magnetic means are located.

4. Apparatus as in claim 3, wherein a manually operable switch is provided in an electric circuit to the electro-magnetic means.

5. Apparatus as in claim 4, wherein the electro-magnetic means includes an electromagnet positioned at one side of the ball and another electro-magnet positioned at an opposite side of the ball, and both electro-magnets are inclined toward the vertical axis of the permanent magnet.

6. Apparatus as in claim 1, wherein the holder is cylindrical, the mirror is fixed upon the surface of a lid, and the lid is rotatively seated upon the holder whereby the lid may be rotatively adjusted relative to the holder to position the reflected beam of light from the mirror onto the zero point of the scale.

7. Apparatus for detecting and indicating to an observer the presence of ferromagnetic material moving through the magnetic field of a permanent magnet element of the apparatus, the apparatus comprising in combination: a transparent container of non-magnetic material, the container having an upper compartment and a lower compartment sealed from each other by a common wall; a liquid in the upper compartment; a magnet unit floating in the liquid; the unit including a cylindrical hollow holder formed of nonmagnetic material, top and bottom walls sealing over opposite ends of the holder, a permanent magnet centered in the holder and fixed to the holder with its north pole uppermost, and a mirror mounted upon the top wall of the holder; a soft ferrite mass fixed upon a floor of the lower compartment of the container and having an axis coaxial with that of the unit; the magnet having a magnetic attraction for the soft ferrite mass but not strong enough to draw the unit down to the common wall of the container, whereby such limited attraction the unit is maintained coaxial with the soft ferrite mass and floating in the upper compartment; the unit being adapted to rotate about its axis from a normal at rest northerly oriented position as the magnet is magnetically attracted in the direction of a ferromagnetic material caused to be moved by a person through the magnetic field of the magnet; a readout scale located at a distance from the unit and having a zero mark thereon; a light beam projecting instrument casting a beam of light upon the mirror and the mirror in its at rest condition with the unit reflecting the beam of light onto the zero mark; and the mirror adapted upon being rotated with the unit to move the reflected beam of light away from the zero mark as an indication to an observer of a ferromagnetic material passing through the magnetic field of the magnet.

8. Apparatus as in claim 7, wherein the mirror is mounted upon a cap covering the unit, and the cap is rotatively adjustable relative to the unit to position the reflected beam of light onto the zero mark of the readout scale.

9. Apparatus as in claim 7, wherein the magnet unit is adapted to return to its normal at rest position after the ferromagnetic material has passed through the magnetic field of the magnet and to oscillate before coming to a rest, and wherein electro-magnetic means is located in the lower compartment adjacent to the soft ferrite mass and is adapted upon being energized to curb such oscillation of the unit.

* * * * *